United States Patent
Pavlik et al.

(10) Patent No.: US 11,850,756 B2
(45) Date of Patent: Dec. 26, 2023

(54) ROBOT MONITORING AND ERROR DETECTION SYSTEM

(71) Applicant: WaferPath, Inc., Milpitas, CA (US)

(72) Inventors: Frantisek Pavlik, Los Altos Hills, CA (US); James Thomas McCartney, III, Conroe, TX (US)

(73) Assignee: WaferPath, Inc., Milpitas, CA (US)

( * ) Notice: Subject to any disclaimer, the term of this patent is extended or adjusted under 35 U.S.C. 154(b) by 297 days.

(21) Appl. No.: 16/916,739

(22) Filed: Jun. 30, 2020

(65) Prior Publication Data

US 2021/0402607 A1 Dec. 30, 2021

(51) Int. Cl.
*B25J 9/16* (2006.01)
*H01L 21/687* (2006.01)

(52) U.S. Cl.
CPC ........... *B25J 9/1674* (2013.01); *B25J 9/1628* (2013.01); *H01L 21/68707* (2013.01)

(58) Field of Classification Search
CPC ...... B25J 9/1674; B25J 9/1628; B25J 13/085; H01L 21/68707; H01L 21/67288; H01L 21/67766; H01L 21/6838; H01L 21/67778; G06F 19/00; G06N 3/008; B62D 57/032; G05D 1/0274; G05D 1/0255; G05D 1/0246; G05D 1/0242; A61B 19/22; A61B 19/5215; G05B 2219/45083; G05B 2219/32222; G05B 2219/37214

See application file for complete search history.

(56) References Cited

U.S. PATENT DOCUMENTS

| | | | |
|---|---|---|---|
| 4,372,721 A * | 2/1983 | Harjar | B25J 9/0081 414/730 |
| 2007/0126568 A1* | 6/2007 | Yang | G05B 19/4184 340/501 |
| 2008/0247549 A1* | 10/2008 | Blanc | B25J 9/1674 380/277 |
| 2009/0166490 A1 | 7/2009 | Liao | |
| 2011/0166704 A1 | 7/2011 | Hashimoto | |
| 2013/0090760 A1 | 4/2013 | Jung et al. | |
| 2014/0074286 A1* | 3/2014 | Geheb | G05B 19/409 700/245 |

(Continued)

OTHER PUBLICATIONS

"International Application Serial No. PCT US2021 039324, International Search Report dated Sep. 28, 2021", 2 pgs.

(Continued)

*Primary Examiner* — Abby Y Lin
*Assistant Examiner* — Dylan Brandon Mooney
(74) *Attorney, Agent, or Firm* — Schwegman Lundberg & Woessner, P.A.

(57) ABSTRACT

A method of operating a robot includes detecting the occurrence of an abnormal operating condition of the robot during operation from hardware state data relating to the operation of the robot system. In response, current hardware state data of the robot at the time of the detection is captured, including robot positional information. A counter corresponding to the abnormal operating condition may then be incremented and, if the counter exceeds a threshold value or exceeds a threshold value in a certain time, a report may be generated including the captured hardware state data. The abnormal condition may for example be a fluctuation in vacuum level or a data transmission error.

18 Claims, 12 Drawing Sheets

(56) References Cited

U.S. PATENT DOCUMENTS

2016/0345791 A1* 12/2016 Britain ................ G07C 5/0808
2017/0311494 A1 10/2017 Hayashi
2019/0030730 A1 1/2019 Tanaka et al.
2019/0329408 A1* 10/2019 Xiong ................ B25J 11/0035

OTHER PUBLICATIONS

"International Application Serial No. PCT US2021 039324, Written Opinion dated Sep. 28, 2021", 3 pgs.

* cited by examiner

ROBOT MONITORING AND ERROR DETECTION SYSTEM

BACKGROUND

The concepts described herein relate to the field of robotics generally and more particularly but not exclusively to wafer transfer robots used in semiconductor fabrication facilities. To ensure high fab productivity, wafer transfer robots need to transfer wafers fast but securely, to ensure fast throughput without risking damage to wafers, the value of which can be substantial.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
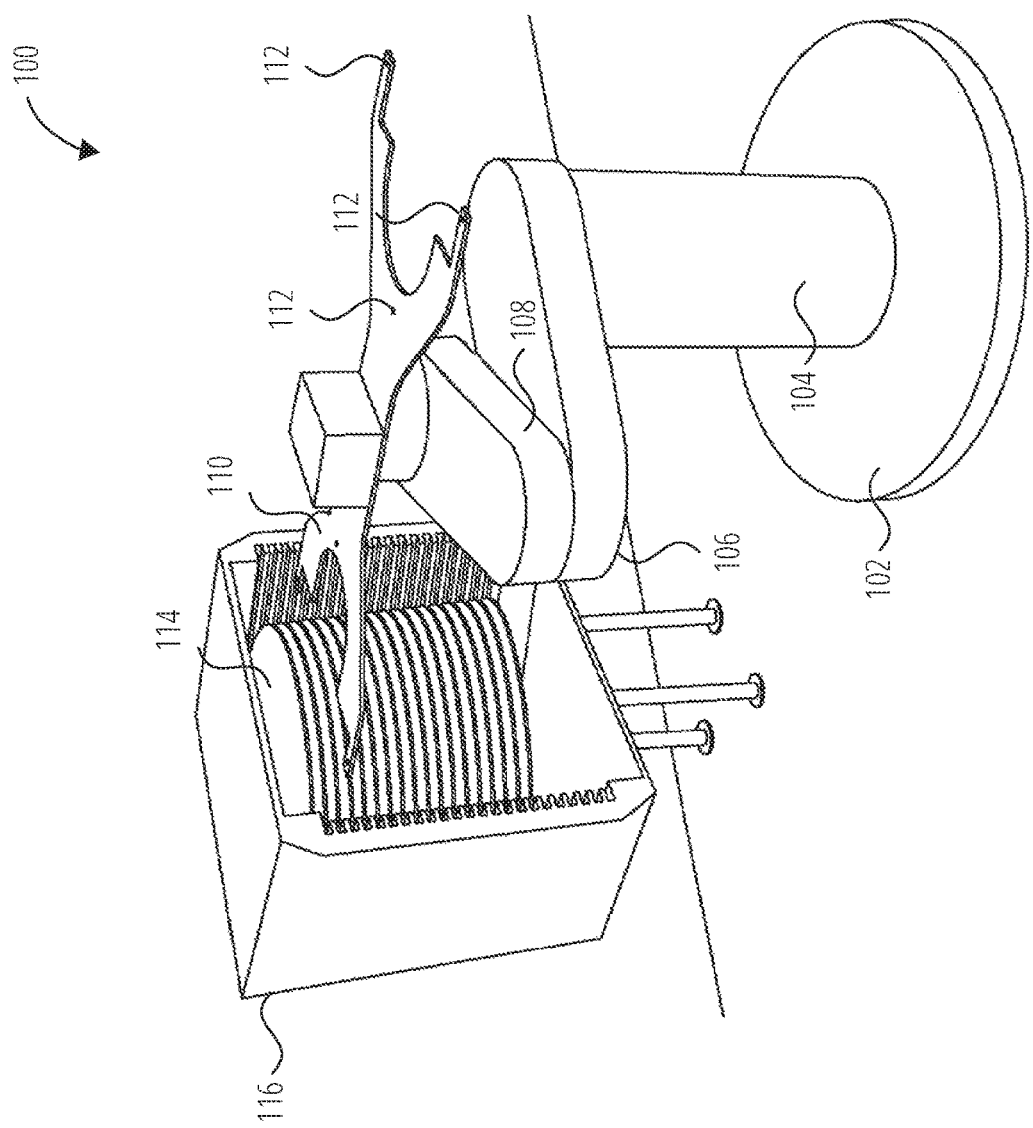
FIG. 1 illustrates a wafer transfer robot in an example embodiment.

FIG. 1 illustrates a wafer transfer robot 100 according to one example embodiment. The wafer transfer robot 100 includes a base 102, a support column 104, a robot arm including one or more segments 106, 108 and an end effector 110. In some cases, the wafer transfer robot 100 may be located on a track that can be used to move the wafer transfer robot 100 back and forth between different locations. Located on the end effector 110 are one or more vacuum ports 112. The vacuum ports 112 are used to secure an item such as a wafer 114 (illustrated in a cassette 116) on top of the end effector 110. The vacuum ports 112 are coupled to a vacuum supply (not shown) via a channel underneath the end effector 110 that is in turn coupled to a vacuum supply tube that passes through the segments 106 & 108, the support column 104 and the base 102.

The support column 104 can be moved up and down and rotated about its primary axis under computer control, while segment 108 can similarly be rotated relative to segment 106 and the end effector 110 can be rotated relative to segment 108, also under computer control. In use in the situation illustrated in FIG. 1, the end effector 110 is moved underneath a wafer 114 and raised until the suction of the vacuum ports 112 engages the wafer 114, at which time the wafer can be withdrawn from the cassette 116. The wafer 114 is then transferred to another location (e.g. another cassette, a wafer prealigner, a wafer processing station etc.) by movements performed by the wafer transfer robot 100.

Figure 2:
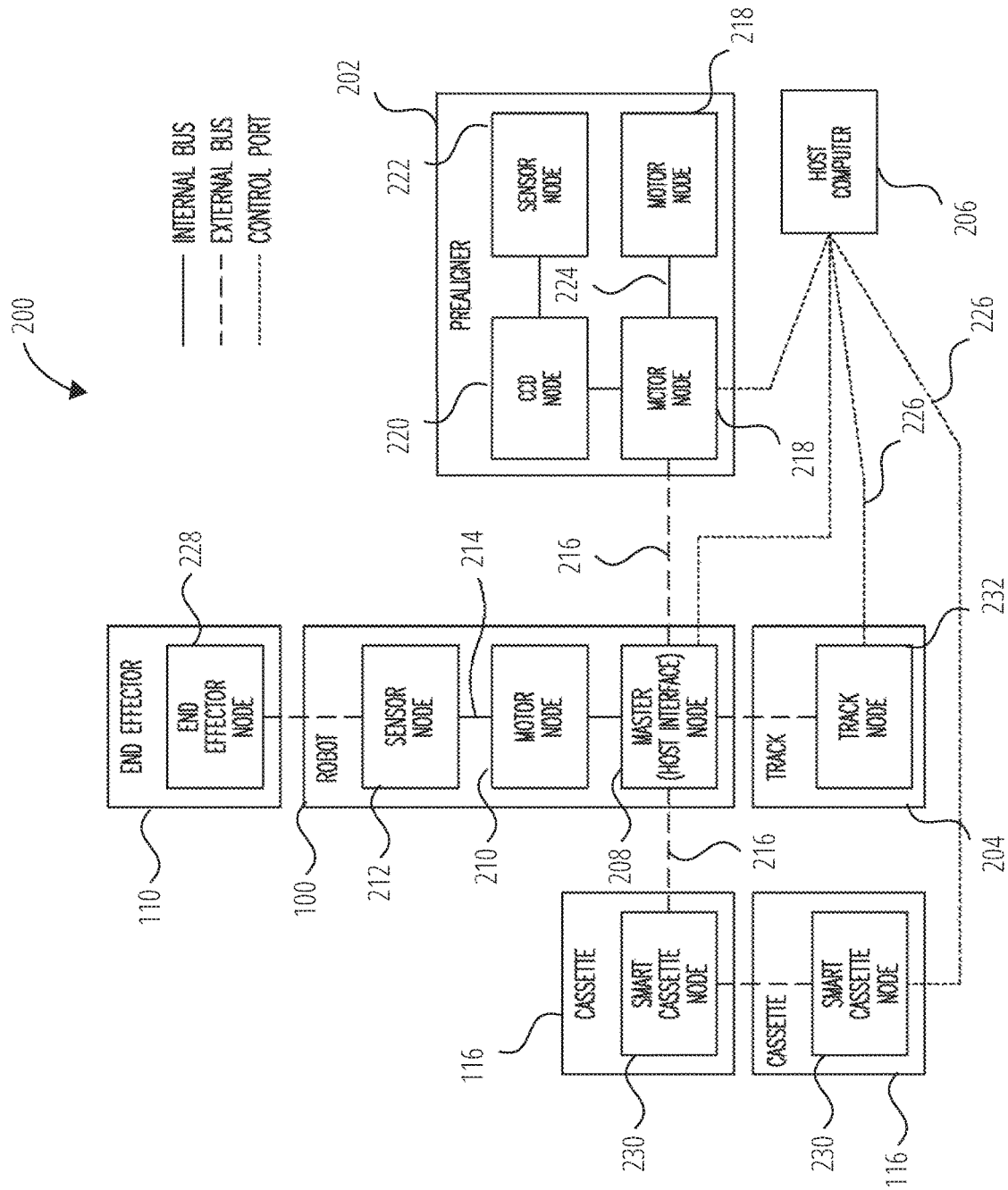
FIG. 2 illustrates an example of a wafer transfer system in which the wafer transfer robot of FIG. 1 may be used.

FIG. 2 is a schematic illustration of one example of a wafer transfer system 200 showing the computing elements and data paths associated with the wafer transfer robot 100 and related components such as an end effector 110, cassettes 116, a prealigner 202, a track 204 and a host computer 206. Additional or different components, for example a wafer inspection station, may be provided depending on the requirements of the fabrication facility.

As can be seen from the figure, wafer transfer robot 100 includes a master node 208, responsible for coordinating operations performed by other nodes, at least one motor node 210 and at least one sensor node 212. The master node serves to control the wafer transfer robot 100 while the motor nodes 218 serve to control motors that move the support column 104, segment 106 and 108 on one or more axes. The sensor nodes 212 receive and forward digital or analog data from various sensors that are used to control or characterize the operation of the robot, for control, feedback, diagnostics or other purposes. For example, sensors may include angular or linear positional sensors, vacuum sensors, optical sensors etc. as is known in the semiconductor processing field.

Communication between the master node 208, motor node 210 and the sensor node 212 of the wafer transfer robot 100 take place by means of an internal bus 214. The master node 208 communicates with the cassette 116, the prealigner 202, the track 204 and the end effector 110 by means of an external bus 216. The master node 208 is also communicatively coupled to the host computer 206 by a control link 226.

The prealigner 202 includes one or more motor nodes 218, an optical sensor node 220 (in the illustrated example, a CCD) and a sensor node 222. Communication within the prealigner 202 takes place over an internal bus 224. The prealigner 202 is communicatively coupled to the wafer transfer robot 100 by means of an external bus 216 and optionally to the host computer 206 by means of the control link 226.

The end effector 110 includes an end effector node 228 communicatively coupled to the wafer transfer robot 100 by means of external bus 216, while the cassettes 116 include smart cassette nodes 230 that may be communicatively coupled to the wafer transfer robot 100 or to each other by the external bus 216. Cassette nodes 230 may also optionally be coupled to the host computer 206 by means of control link 226. Finally, track 204, which positions the wafer transfer robot 100 linearly, includes a track node 232 that is coupled to the wafer transfer robot 100 by the external bus 216 and optionally the control link 226 to the host computer 206.

In use, the wafer transfer system 200 operates under the control of the host computer 206 and/or the master node 208 to move wafers between cassettes 116 and/or between the cassettes 116 and stations like the prealigner 202, to accomplish wafer transfers required by the fabrication facility.

Each node in the robot (and optionally also in other components) is composed of multiple integrated circuits (for example, a microprocessor or a field programmable logic array) that work together to perform assigned tasks. The data exchanged between nodes is organized into application specific transactions that direct actions on each node.

Figure 3:
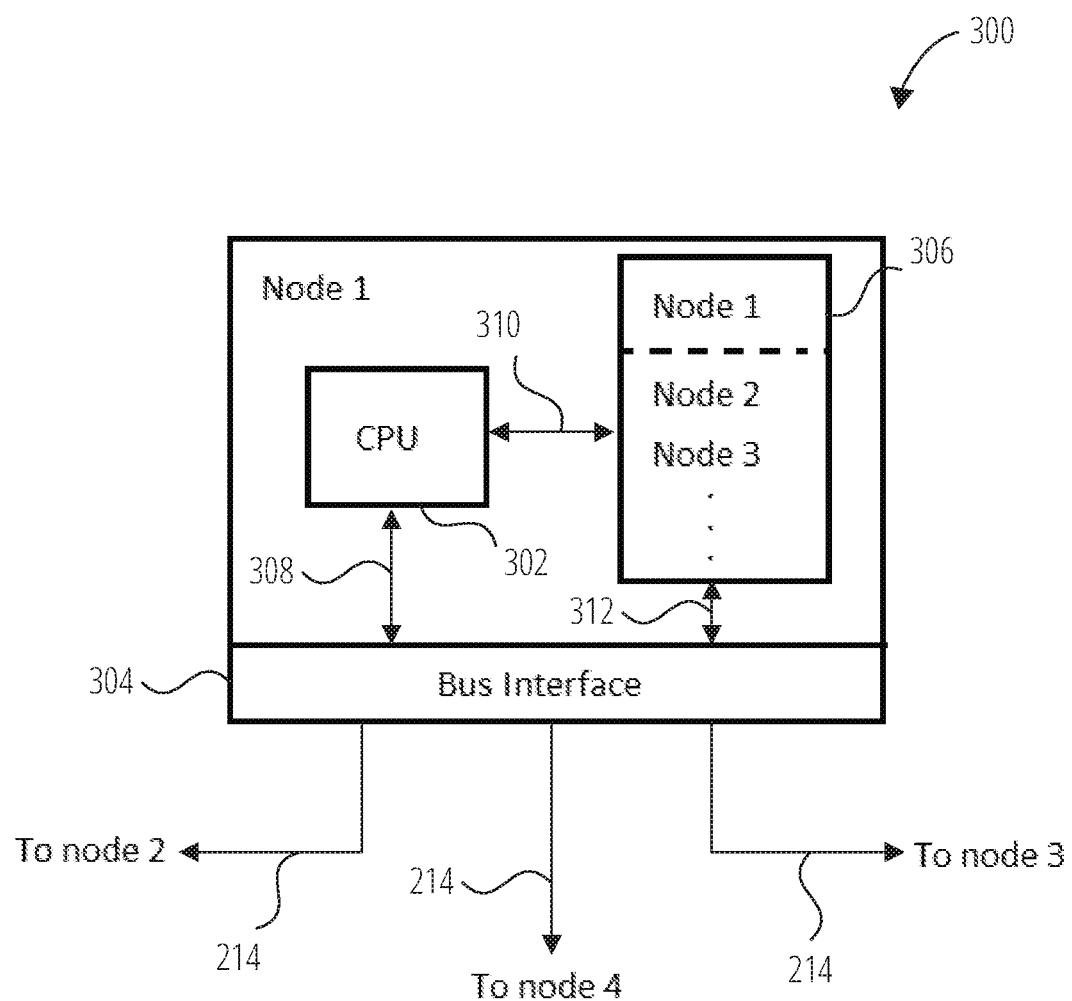
FIG. 3 illustrates an example of one of the nodes of the wafer transfer system shown in FIG. 2.

FIG. 3 schematically illustrates a node 300 in one example. The node 300 corresponds to one or more of the nodes illustrated in FIG. 2, e.g. master node 208, motor node 210, sensor node 212, end effector node 228 etc. As can be seen, the node includes a CPU 302, a bus interface 304 and a hardware information register 306. The CPU 302 controls the overall function of the node 300 and communicates with the bus interface 304 via bus 308 and with hardware information register 306 via bus 310. The hardware information register 306 includes hardware state data for the node 300 itself (for example positional data at motor node 210 or sensor data from sensor nodes 212) (indicated by "Node 1" in hardware information register 306) as well as hardware state data for other nodes (indicated by "Node 2," "Node 3" etc.) The hardware information register 306 transmits and receives hardware state data to and from other nodes via bus 312 and bus interface 304. The bus interface 304 in turn communicates with other nodes via the internal bus 214. Hardware state data is any data that characterizes the operation of the wafer transfer system 200, including sensor data representing vacuum levels, robot arm positions, optical sensor outputs, data transmission parameters within the internal bus 214 or external bus 216, etc.

At initialization of the wafer transfer system 200, the internal bus 214 performs transactions to establish communications between adjacent nodes 300. If a communications link is successfully established, the transfer of hardware state data (from each node's hardware information register 306) between adjacent nodes 300 starts. If the system consists of more than two non-adjacent nodes 300, data from non-adjacent nodes is exchanged in a relay fashion, for example in FIG. 2 from master node 208 to motor node 210 to sensor node 212 to end effector node 228 and vice versa. This hardware state data exchange continues for the duration that the system is operational. Software data exchange is accomplished by the CPU 302 writing a request to a data register in a bus controller for the bus interface 304. The software transfer is then scheduled and accomplished by the bus controller, but priority is given to the hardware state data as discussed in more detail below.

Hardware state data and software messages are exchanged over the internal bus 214 using a data packet having the following format:

| Header | Data | CRC |
| --- | --- | --- |

The packet header includes a packet ID, a source address, a destination address, a data type identifier, and a received packet confirmation. The data included in the packet can be any relevant data or commands. A cyclic redundancy check (CRC) value is included to permit the determination of whether or not any of the data have been corrupted during transmission of the packet.

Packets containing hardware state data are transmitted every alternate packet. Other data, for example software request/reply commands or data from sensors that change relatively slowly (e.g. temperature sensors), are transmitted between alternating hardware state data packets. The priority of the other data is determined by the bus controller.

A packet received by one node is transmitted to all the other nodes (except the node from which it is received), regardless of the destination address of the packet. If a packet received by a node is addressed to that node, any request or reply commands are executed by that node and any hardware state information for other nodes is updated in the hardware information register 306. Even though the packet is addressed to a receiving node, it is nevertheless transmitted to adjacent nodes so that their hardware information registers 306 can be updated with any hardware state information in the packet.

If a received packet is not addressed to a node, that node will ignore any request or reply commands in the packet but will update its hardware information register 306 with any hardware state information in the packet from other nodes contained in the packet. Prior to transmitting any packet to an adjacent node, any updated hardware state information for the transmitting node 300 is included in the packet. This transmission protocol is thus stateless and session-less, and provides reliable transfer of both hardware state data and software request/reply commands between nodes 300.

An advantage of this protocol is that hardware state data is transmitted rapidly between the nodes. Also, since hardware state data is transmitted in every alternate packet, and it is known how many transmission steps occur between non-adjacent nodes, the time delay between a hardware state update at one node and the receipt of that updated state at another node is known. This permits accurate control and diagnostics.

Figure 4:
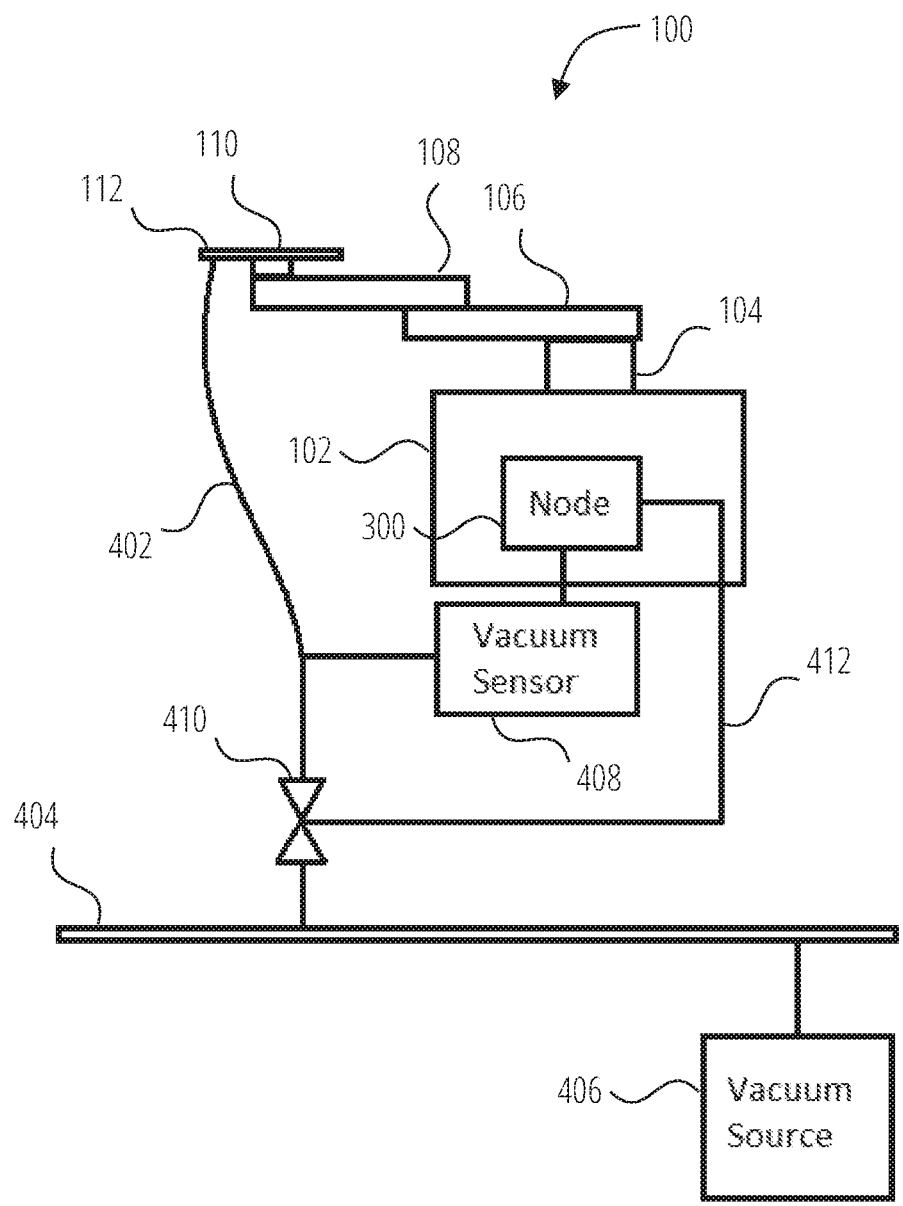
FIG. 4 is a schematic diagram showing the wafer transfer robot of FIG. 1, including associated vacuum supply and sensing hardware.

FIG. 4 is a schematic diagram showing the wafer transfer robot of FIG. 1, including associated vacuum supply and sensing hardware. As can be seen from the figure, the robot includes a vacuum line 402 that is coupled to a vacuum supply line 404 that is in turn coupled to a vacuum source 406. The vacuum line 402 is in actuality routed through the base 102, the support column 104, the segment 106, the segment 108, and along the end effector 110 to the vacuum ports 112, but it is shown outside the wafer transfer robot 100 in FIG. 4 for ease of explanation.

Attached to the vacuum line 402 is a vacuum sensor 408 that senses the vacuum level in vacuum line 402 and reports it to the node 300, for example the master node 208. Included in the vacuum line 402 between the vacuum sensor 408 and the vacuum supply line 404 is a valve 410 that can be actuated by the node 300 via a control line 412 to connect and disconnect the vacuum line 402 (and thus the vacuum ports 112) to and from the vacuum supply line 404. In some cases, the valve 410 allows for variable vacuum control. As discussed above with reference to FIG. 1, the suction provided at the vacuum ports 112 by the vacuum line 402 is used to hold a wafer on the end effector 110 during wafer transfer operations. As discussed in more detail below, the output of the vacuum sensor 408 can provide valuable information that can be used in operation of the wafer transfer robot 100.

Figure 5:
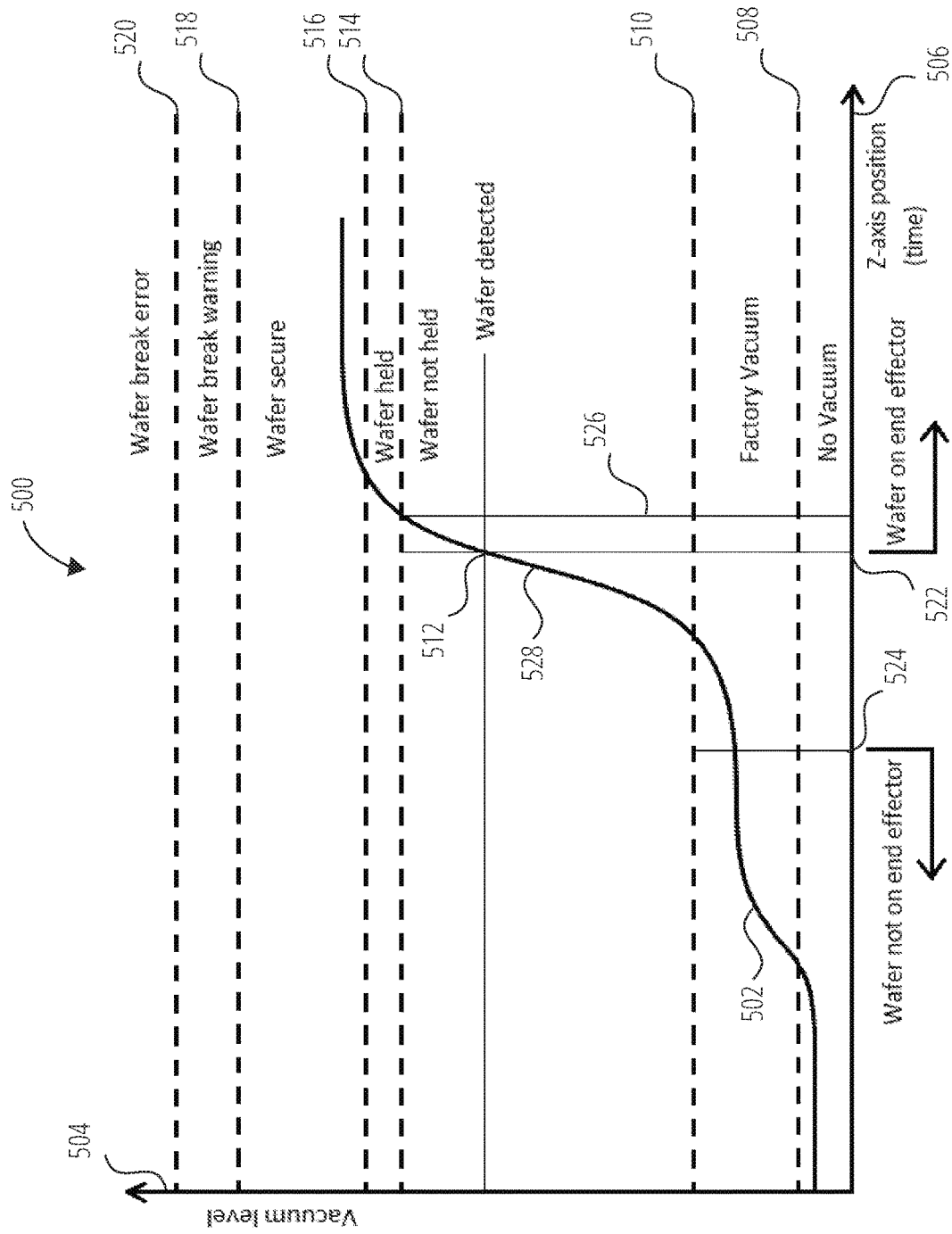
FIG. 5 is a graph of z-axis position or time versus vacuum level for a wafer transfer pick operation undertaken by the wafer transfer robot of FIG. 1, according to an example embodiment.

FIG. 5 is a graph 500 with a curve 502 that shows the relationship between the vacuum level (on the y-axis 504) detected by vacuum sensor 408 as the end effector 110 approaches and makes contact with a wafer 114 to pick it up. The z-axis position (height) of the end effector 110 is shown on the x-axis 506. The x-axis 506 may also represent time, in which case a similar curve 502 will be presented as the end effector 110 approaches and makes contact with a wafer 114 to pick it up via the contact surface.

For purposes of illustration, the graph 500 shows the transition from no vacuum on the vacuum line 402 to factory-level vacuum. In many cases, the initial vacuum level will be at a steady state factory vacuum level.

As can be seen from graph 500, the vacuum level is initially below level 508 when there is no vacuum on vacuum line 402. When the valve 410 is opened, the vacuum level transitions to a steady state (in the absence of movement of the end effector towards the wafer 114.) This factory vacuum level will nominally be detected between level 508 and level 510. If the detected state is above level 510, this information is useful in detecting an abnormal vacuum condition.

Although the vacuum ports 112 of the end effector 110 are not blocked at this time, internal resistance in the vacuum line 402 creates a pressure differential between the ambient pressure at the vacuum ports 112 and the pressure level detected by the vacuum sensor 408. At this steady state vacuum level, it can be deduced with sufficient certainty for that a wafer 114 is not on the end effector 110. As the z-axis value passes position 524, the vacuum level starts increasing as a result of the proximity of the wafer 114 to the vacuum port 112 and it can no longer be concluded with certainty whether or not a wafer is on the end effector 110.

As the end effector 110 now approaches the wafer (increasing z-value), the vacuum level detected by the vacuum sensor 408 rises above the upper factory vacuum level 510 and below level 514, which is considered to be a wafer not held zone. As the end effector 110 approaches the wafer, the vacuum level will continue increasing until a wafer detected position 512 is reached. Based on this vacuum level, it can be concluded with sufficient certainty that for z-axis values above position 522, the wafer is on the end effector 110 but it cannot yet be concluded that the wafer 114 is being held sufficiently by the end effector 110.

Also, the z-axis position 522 corresponding to the wafer-detected vacuum level provides useful information about the height of the wafer in the cassette 116 and the height of the particular slot in the cassette 116 in which the wafer is found, which can be used by the master node 208 and/or the host computer 206. For example, this value can be used to position the end effector 110 more accurately before reaching into a cassette to lift a wafer the next time, or when returning the wafer 114 to the cassette 116, saving time.

As the end effector 110 continues to approach the wafer, the vacuum level increases until the vacuum exceeds level 514, at which time it can be concluded that the wafer 114 is being held by the end effector 110. For z-axis values corresponding to vacuum levels between level 514 and level 516 (the wafer held zone) the wafer is deemed to be held for movement but not securely enough for rapid accelerations or movements of the end effector 110.

The rate of change of the vacuum level in the wafer not held zone (i.e. the slope 528) can also provide useful information. If the value of the slope 528 is within an expected range before the wafer detected position 512, it can be concluded that the wafer is in place in the cassette 116 and will be detected shortly, and if the value of the slope 528 is within an expected range after the wafer detected position 512 is reached then it can be concluded that the wafer held zone is going to be reached. Based on the associated confidence of success that arises from these conclusions, early decisions can be made about the next steps to be taken. In one example, the conclusion that the wafer will be successfully gripped may allow the wafer transfer robot 100 to modify the acceleration or velocity used during the wafer transfer, enabling a shorter time for the transfer.

On the other hand, if the slope 528 is outside an expected range then it is indicative of a problem and appropriate steps or actions can be taken. For example, wafer transfer robot 100 robot can determine that the delay between wafer held and wafer securely held positions will be sufficiently long as to necessitate delay start of wafer transfer. The wafer transfer robot 100 can then modify the acceleration and velocity used for the wafer transfer, enabling a slower motion to begin earlier, again reducing total wafer transfer time.

For z-axis values above vacuum level 516 and below level 518 (the wafer secure zone), the wafer is deemed to be securely held and can be moved at maximum permissible speeds or accelerations. Above vacuum level 518 and below level 520 (the wafer break warning zone), there is a risk of wafer breakage and a wafer break warning error message is provided and/or movement of the robot ceases and the valve 410 is closed to cut off the vacuum line 402 from the vacuum supply line 404. If valve 410 allows for variable vacuum control, the sensor data can be used to effect a partial closure of valve 410, thereby reducing the vacuum level to safe levels. Above vacuum level 520 it is likely that the wafer has broken and a wafer break error message is provided and/or movement of the robot ceases and the valve 410 is closed to cut off the vacuum line 402 from the vacuum supply line 404.

The determination that the vacuum level is in, or has entered, one of the three or more zones shown in FIG. 5, or is at, or has reached or passed, one of the levels shown in FIG. 5 can be used to change the operating state of the wafer transfer robot 100, or prevent a desired operating state from occurring. Similarly, unexpected fluctuations of the vacuum level within one of the zones, or the unexpected departure of the vacuum level from one of the zones can be used to change the operating state of the wafer transfer robot 100, or prevent a desired operating state from occurring. That is, a vacuum zone in which the wafer transfer robot 100 finds itself or associated transitions between zones can be correlated to operating states for the robot.

For example, if the wafer transfer robot 100 receives a command to pick up a wafer 114, but the vacuum level is below level 508 (i.e. in the "No vacuum zone"), the command will not be executed and a warning notification will be provided. This could for example indicate a problem with the vacuum source 406 or with the valve 410. Similarly, if z-axis value is below position 524 but the vacuum level is above the factory vacuum level 510, then there may be a blockage or restriction in the vacuum line 402 and the command may not be executed and a warning notification will be provided.

The levels and the zones shown in FIG. 5 are user-settable, and may vary depending on the vacuum level provided at source 406, the wafer material, wafer thickness etc. For example, the wafer break warning and wafer break error zones will occur at lower vacuum levels for wafers that are thinner or made of a more fragile material. Presets can also be provided so that particular levels/zones can easily be selected manually by an operator or the master node 208 or host computer 206 upon receipt of wafer parameters.

Also, as described below with reference to FIG. 6 to FIG. 8, the behavior of the vacuum level with respect to time can be used in operation of the wafer transfer system 200.

Figure 6:
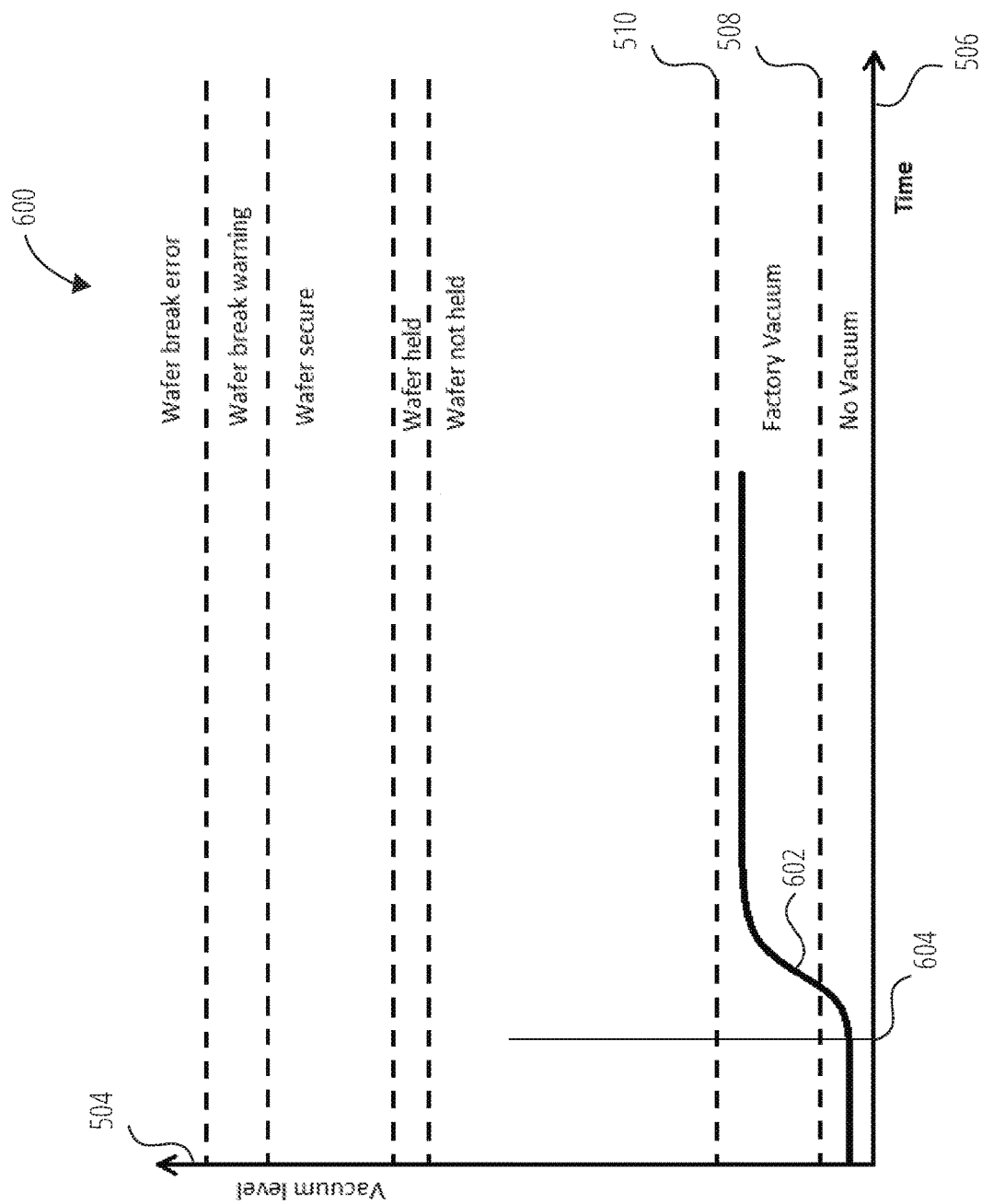
FIG. 6 is a graph of time versus vacuum level after vacuum actuation with no wafer on the end effector of the wafer transfer robot of FIG. 1, according to an example embodiment.

FIG. 6 is a graph 600 with a curve 602 that shows the normal relationship between the vacuum level (on the y-axis 504) versus time (shown on x-axis 506) detected by vacuum sensor 408 when the factory vacuum is switched on (i.e. vacuum valve 410 is opened) with no wafer on the end effector 110.

As can be seen from graph 600, the vacuum level shown by curve 602 is initially below level 508 when there is no vacuum on vacuum line 402. When the valve 410 is opened at time 704, the vacuum level transitions to a steady state level nominally between level 516 and level 518.

At this steady state vacuum level, it can be deduced with sufficient certainty for that a wafer 114 is not on the end effector 110 and that there is no apparent problem with the vacuum supply or supply lines. Normal operation of the wafer transfer system 200 can then commence in a vacuum normal and no wafer state.

Figure 7:
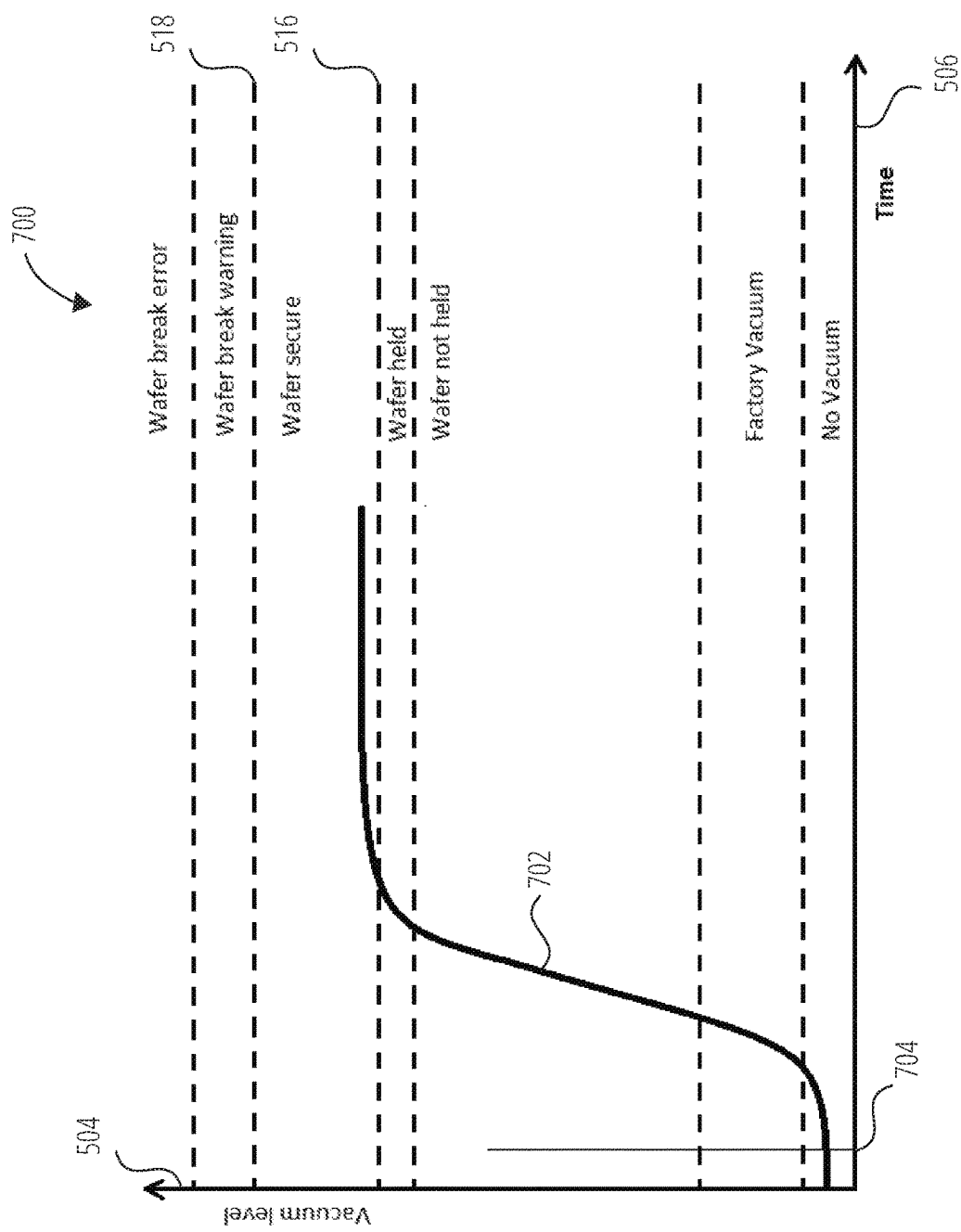
FIG. 7 is a graph of time versus vacuum level after vacuum actuation with a wafer on the end effector of the wafer transfer robot of FIG. 1, according to an example embodiment.

FIG. 7 is a graph 700 with a curve 702 that shows the normal relationship between the vacuum level (on the y-axis 504) versus time (shown on x-axis 506) detected by vacuum sensor 408 when the factory vacuum is switched on (i.e. vacuum valve 410 is opened) and there is a wafer 114 on the end effector 110.

As can be seen from graph 700, the vacuum level shown by curve 702 is initially below level 508 when there is no vacuum on vacuum line 402. When the valve 410 is opened at time 704, the vacuum level rises to a steady state wafer secure level nominally between level 516 and level 518.

At this steady state vacuum level, it can be deduced with sufficient certainty that a wafer 114 is on the end effector 110. Normal operation can then commence in a vacuum normal and wafer secure status, or if a wafer is not expected on the end effector 110 by the host computer 206 or the master node 208, appropriate remedial action can be taken including for example, not commencing operations, moving the robot into a safe position in which the wafer 114 can be removed and/or providing appropriate warnings or other notifications.

Figure 8:
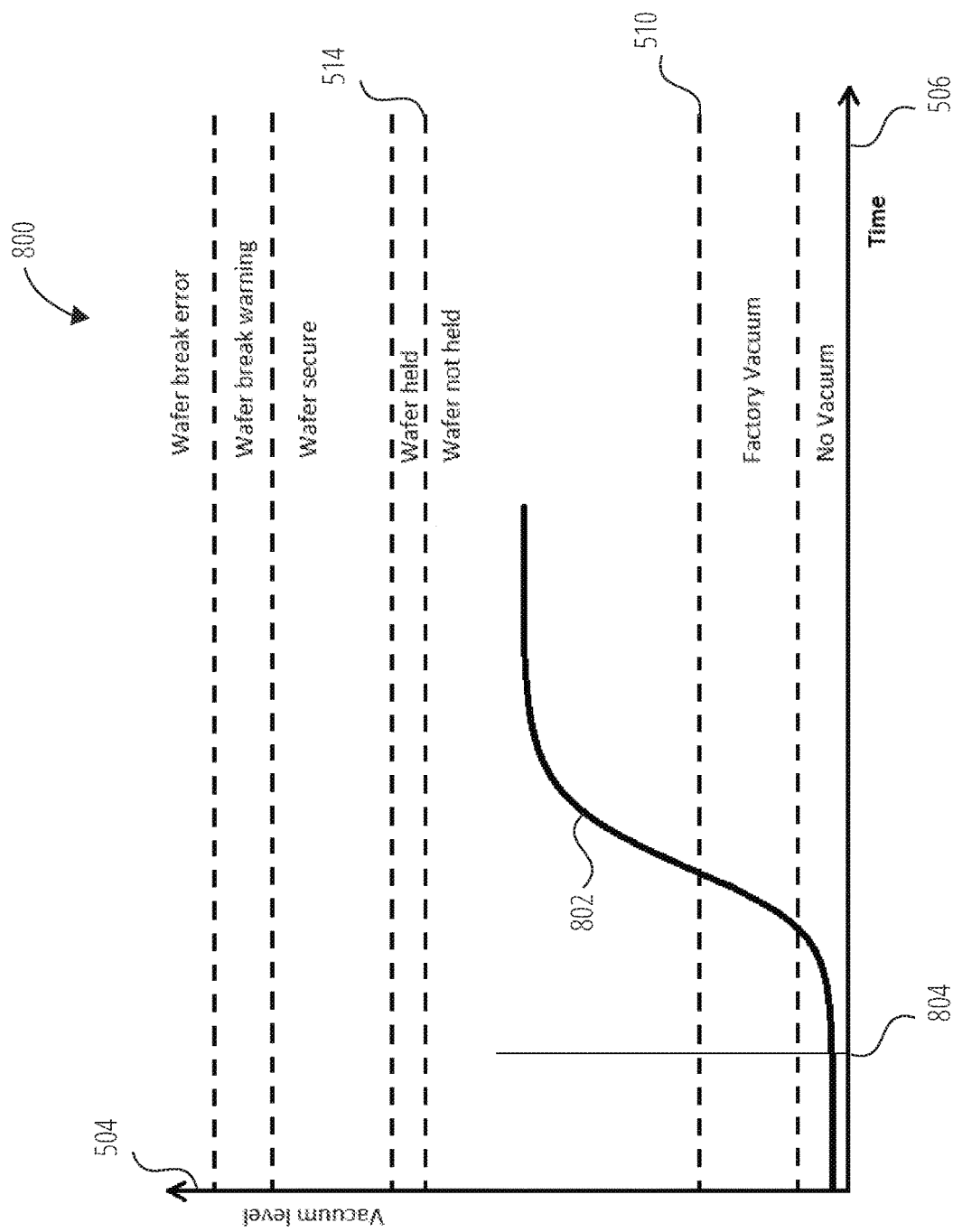
FIG. 8 is a graph of time versus vacuum level when there is a restriction or partial blockage in the vacuum line. of the wafer transfer robot of FIG. 1, according to an example embodiment.

FIG. 8 is a graph 800 with a curve 802 that shows the relationship between the vacuum level (on the y-axis 504) versus time (shown on x-axis 506) detected by vacuum sensor 408 when the factory vacuum is switched on (i.e. vacuum valve 410 is opened) and there is a restriction or partial blockage in the vacuum line 402 or vacuum supply line 404.

As can be seen from graph 800, the vacuum level shown by curve 802 is initially below level 508 when there is no vacuum on vacuum line 402. When the valve 410 is opened at time 704, the vacuum level rises to a level nominally between level 510 and level 514 in the wafer not held zone above the factory vacuum zone. This indicates a possible pinch in the vacuum line 402 or other blockage or restriction, e.g. from fragments of a broken wafer that may have found their way into the vacuum line 402. In such a case, normal operation will not commence and and/or other appropriate warnings or notifications will be provided.

As will be described below, in use and under control of one or more processors in the master node 208 and/or host computer 206, in one example the wafer transfer robot 100 is operating in a first state when there is a detection (using output from the vacuum sensor 408) of a transition of a vacuum parameter (e.g. a vacuum level) from a first vacuum parameter zone (e.g. one of the zones described above with reference to FIG. 5) to a second vacuum parameter zone (e.g. another one of the zones described above with reference to FIG. 5), and based on detecting the transition of the vacuum parameter from the first vacuum parameter zone to the second vacuum parameter zone, the operating state of the robot is changed from the first state to a second state.

Figure 9:
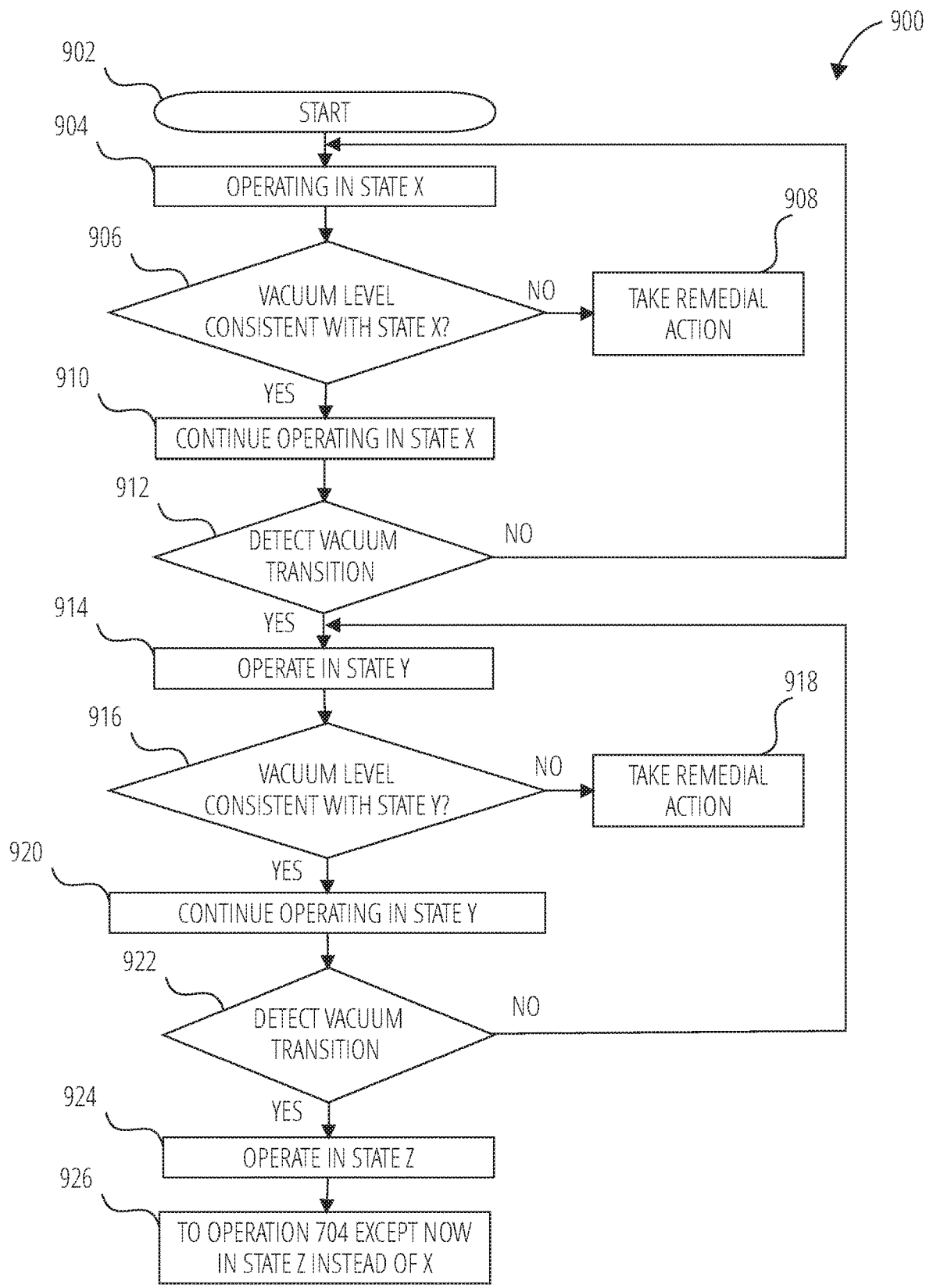
FIG. 9 is a flowchart showing how the operating state of the wafer transfer robot shown in FIG. 4 may vary based on detected vacuum levels, according to an example embodiment.

More particularly, FIG. 9 is a flowchart 900 showing a method of operating the wafer transfer robot 100 using the vacuum levels and zones described with reference to FIG. 5 in one example. Flowchart 900 is an example of the use of a vacuum parameter and vacuum parameter levels, zones or ranges in the operation of wafer transfer robot 100. Other vacuum parameters and vacuum parameter levels, zones or ranges may also be used in flowchart 900. For example, instead of or in addition to the use of vacuum levels and vacuum zones, the rate of change or slope of the vacuum level as reported by the vacuum sensor 408 may be compared with expected ranges of rate of change or slope of the vacuum level. A rate of change of the vacuum level may be determined with reference to displacement (e.g. z-axis value), time, speed or other displacement or time-related value.

The method begins at operation 902 with the robot in a first operating state, state X. The operating state of the robot can be any operating state, for example an idle state, a state in which the end effector 110 is being moved into a cassette 116 to pick up a wafer 114, the end effector 110 is being raised underneath a wafer 114 to pick it up, is withdrawing/returning the wafer 114 from/to a cassette 116, etc. In this state, the master node 208 or host computer 206 is receiving sensor data from various sensors that are used to control or characterize the operation of the robot, for control, feedback, diagnostics or other purposes. For example, as discussed above, the sensors may include angular or linear positional sensors, vacuum sensors, optical sensors etc. as is known in the semiconductor processing field. This data may be obtained directly by master node 208 or may be forwarded from sensor nodes 212. As discussed herein, the determinations, adjustments and associated data capture are performed by the master node 208 but this could be performed by other data processors, either singly or in combination with the master node 208

In operation 906, it is determined whether or not the vacuum level observed by the vacuum sensor 408 is consistent with state X. A particular operating state is likely to have a normal vacuum level or zone associated with it as discussed above, for example a vacuum level in the "factory vacuum" zone associate with an idle state of the wafer transfer robot 100 with no wafer 114 on the end effector 110, and a vacuum level in the "wafer secure" zone when the wafer transfer robot 100 is moving a wafer 114 at maximum speeds or accelerations. If the vacuum level is consistent with the operating state of wafer transfer robot 100, the method continues at operation 910 with the wafer transfer robot 100 continuing to operate in state X.

In the event that the vacuum level is or becomes inconsistent with state X, remedial action is taken at operation 908. The exact nature of the remedial action will depend on operating state X and the nature of the inconsistency between the normal vacuum level and the unexpected vacuum level. For example, in an idle or "ready" state with no wafer 114 on the end effector 110, if the vacuum level is below level 508 then a "no factory vacuum" error message will be provided and certain operating states may be disabled.

However, if vacuum level is above level 510, that is, in one of the zones above the factory vacuum zone, an error message could be generated indicating a possible pinch in the vacuum line 402 or other blockage or restriction, e.g. from fragments of a broken wafer that may have found their way into the vacuum line 402, or if the wafer 114 is dirty and the seal made by the vacuum ports 112 against the wafer has been affected by particles on the wafer.

In one example, the vacuum line 402 along the end effector 110 is provided as a groove along the bottom of the end effector, which is covered by adhesive tape with the adhesive side facing into the groove. Debris entering the vacuum line will tend to stick to the adhesive tape, and with the passage of time, end up restricting the flow of air through the vacuum line 402, increasing the vacuum level. Again, in addition to providing an error message if the vacuum level is above 510 with the wafer transfer robot 100 in an idle or "ready" state with no wafer 114 on the end effector 110, certain or all operating states may be disabled depending on the magnitude of the discrepancy.

In another example, if the wafer is being moved at maximum permissible speed or under maximum linear or centripetal acceleration while the wafer transfer robot is in a wafer secure operating state, and the vacuum level drops below level 516 but above level 514, that is into the wafer held zone, the wafer transfer robot can enter a wafer held operating state in which the permissible speeds and accelerations are reduced to ensure that the wafer 114 does not fall off the end effector 110. This has the advantage that the wafer transfer robot 100 can continue to operate, albeit with reduced efficiency, until any problem can be diagnosed and solved.

On the other hand, if the vacuum level falls below level 514, to the wafer-not-held zone, when it is expected to be above this level and in the wafer held or wafer secure zone, the wafer transfer robot 100 will gradually be brought to a halt and an error message generated. Preferably, this movement will move the end effector 110 into a predetermined wafer recovery position in which the wafer 114 can be removed easily and safely.

Still further, if the wafer 114 is being moved while the wafer transfer robot 100 is in a wafer secure state and the vacuum level goes into the wafer break warning zone above level 518 or the wafer break error zone above level 520, appropriate remedial actions can be taken, such as bringing the robot to a halt and closing the valve 410 to reduce the vacuum level, and an error message can be generated.

As an alternative to disabling the motion and disabling the vacuum if the vacuum goes into either wafer break zone, the remedial action or remedial operating state could be to get the wafer transfer robot 100 into a safe state and into a position in which the wafer 114 can be removed from the end effector 110. For example, after disabling the vacuum by closing valve 410, the wafer transfer robot 100 may move at a very slow speed to a predetermined wafer recovery position in which the wafer 114 can be removed. Also, it may be possible to cycle the valve 410 to generate a low level of vacuum that will enable movement of the wafer transfer robot 100 at an appropriate speed into a position in which the wafer 114 can be removed.

Additionally, a secondary valve with flow control may be provided in the vacuum line 402 to reduce the vacuum level in such a case, or if the valve 410 permits variable vacuum control, this can be used to reduce the vacuum to a lower level at which wafer 114 can be moved by the wafer transfer robot 100 at a reduced speed into a wafer recovery position. Another alternative is for the wafer transfer robot 100 to move the wafer 114 rapidly (under the excessive vacuum) to a wafer recovery position, at which point the vacuum can be disabled.

If no inconsistent vacuum state is detected in operation 906, the method continues at operation 910 with the wafer transfer robot 100 continuing to operate in state X. At operation 912 it is determined whether or not a vacuum parameter transition sufficient to cause a change in operating state is detected. If such a change in vacuum parameter is not detected, the method returns to operation 904 and the wafer transfer robot 100 continues operating in state X, in the absence of an explicit command that will result in it operating in another state.

With regards to operation 912 (and the other operations in FIG. 9. involving a decision or test), it should be noted that there are changes in operating state that can be triggered by a change in vacuum level (i.e. vacuum parameter) and there are changes in operating state that will not be triggered by a change in vacuum level. An example of a change in operating state that is not triggered by a change in vacuum level (even though it involves a change in the vacuum level) is when the wafer transfer robot 100 places a wafer 114 in a cassette 116 and the end effector 110 is withdrawn from the cassette 116 leaving the wafer 114 behind. In such a case, when the wafer is in place in a slot in the cassette 116, the vacuum to the vacuum ports 112 is shut off so that the end effector 110 can be withdrawn from the cassette 116 without pulling out the wafer 114. That is, there are alternate paths for the operation of the wafer transfer robot 100 other than the method shown in FIG. 9, depending on the required goals to be achieved and the state in which the wafer transfer robot 100 finds itself.

Also, unlike the check done in operation 906, potentially resulting in remedial action that may also involve a change in operating state of the wafer transfer robot 100, the vacuum parameter transition detected in operation 912 is expected or appropriate and is used to trigger a change of operating state of the wafer transfer robot 100 that is consistent with ongoing robot operations. One example of a vacuum parameter and operating state transition that may occur in operation 912 and operation 914 is when the end effector 110 is being raised towards the underside of the wafer 114 to pick it up. When the vacuum level detected by vacuum sensor 408 passes above level 514 into the wafer held zone, the wafer transfer robot 100 can transition into a state in which withdrawal of the wafer 114 from the cassette 116 can commence. Since the initial acceleration when withdrawing the wafer 114 from the cassette 116 is relatively low, the transfer of the wafer can begin without waiting for the vacuum level to enter the wafer secure zone above level 516. Alternatively, the wafer movement can commence at a lower acceleration than might be possible in the wafer secure zone. Not having to wait for the vacuum level to enter the wafer secure zone before commencing wafer transfer saves time and increases the efficiency of the wafer transfer robot 100.

Upon detection of the change in vacuum level in operation 912 (e.g. into the wafer held zone), the wafer transfer robot 100 begins operating in new state Y (e.g. the operational state of translational movement of the wafer 114 by withdrawing it from the cassette 116). At operation 916, it is determined whether or not the vacuum level is consistent with state Y. As discussed above with reference to operation 906, operating state Y is likely to have a normal vacuum level or zone associated with it. In the example where state Y is an operating state associated with a wafer held vacuum zone, both wafer held and wafer secure zones are consistent with that operating state and do not require remedial action. However, if the vacuum level goes into another state (e.g. below level 514 or above level 518) appropriate remedial action is taken at operation 918 similarly to the actions taken above as discussed with reference to operation 908.

If the vacuum level is consistent with operating state Y as determined in operation 916, the wafer transfer robot 100 continues operating in state Y (linear or rotational translational movement of the wafer at speeds and accelerations appropriate to the wafer held level in the current example) at operation 920. It is then determined in operation 922 whether or not there has been an appropriate change in vacuum level. In the current example, an appropriate change in vacuum level would be from the vacuum held zone to the vacuum secure zone between level 516 and 518. If a vacuum transition is not detected then the method returns to operation 914 and the wafer transfer robot 100 continues operating in state Y.

Upon detection of an expected or appropriate vacuum transition in operation 924, the wafer transfer robot 100 begins operating in state Z. In the current example, with a vacuum transition from the wafer held zone to the wafer secure zone, the wafer transfer robot 100 begins operating in a state in which the wafer 114 is or can be moved at maximum speeds and accelerations. As shown in operation 926, the method can now return to operation 904 except with the wafer transfer robot 100 now operating in state Z instead of state Y.

The method of FIG. 9 can then continue as described above, with changes or remedial actions taking place based on the vacuum parameter(s) and as appropriate for the tasks and operating conditions of the wafer transfer robot 100 and wafer transfer system 200.

Accordingly, disclosed is a method of operating a robot including a vacuum port for engaging an item including, operating (by a one or more processors) the robot in a first state, detecting (using a vacuum sensor) a transition of a vacuum parameter from a first vacuum parameter zone to a second vacuum parameter zone in a plurality of vacuum parameter zones including at least three vacuum parameter zones, and based on detecting the transition of the vacuum parameter from the first vacuum parameter zone to the second vacuum parameter zone, altering, by the one or more processors, the operating state of the robot from the first state to a second state.

The vacuum parameter may be a vacuum level, the first vacuum parameter zone may be an item-not-held vacuum parameter zone, the second vacuum parameter zone may be an item-held vacuum parameter zone and the second state may be translational movement of the item. The method may further include detecting the transition of the vacuum level from the item-held vacuum parameter zone to an item-secure vacuum parameter zone. Based on detecting the transition of the vacuum level from the item-held vacuum parameter zone to the item-secure vacuum parameter zone, the operating state of the robot may be altered from the second state to a third state. The third state may be more rapid translational motion of the item. The vacuum parameter may also be a rate of change of a vacuum level.

The method may further comprise monitoring the vacuum parameter during operation of the robot, detecting an unexpected change in the vacuum parameter based on the state in which the robot is operating and in response to detecting the unexpected change, taking a remedial action.

The vacuum parameter may be a vacuum level, the first vacuum parameter zone may be an item secure vacuum parameter zone and the second vacuum parameter zone may be an item held vacuum parameter zone, in which case the first state may be translational movement of the item and the second state may be slower translational movement of the item. Additionally, the second vacuum parameter zone may be an item breakage vacuum parameter zone, in which case and the second state may be a remedial operating state.

Also disclosed is a robot system including a robot arm, an effector coupled to the robot arm, the effector including a vacuum port for engaging an item, a vacuum line in communication with the vacuum port and being couplable to a vacuum source and a vacuum sensor coupled to the vacuum line. Also included is one or more data processors in communication with the robot arm and the vacuum sensor to control operation of the robot system; and one or more machine-readable mediums storing instructions that, when executed by the one or more processors, cause the system to perform certain operations. The operations may include any of the methods described above, including operating the robot system in a first state, detecting using the vacuum sensor, a transition of a vacuum parameter from a first vacuum parameter zone to a second vacuum parameter zone in a plurality of vacuum zones including at least three vacuum parameter zones, and based on detecting the transition of the vacuum parameter from the first vacuum parameter zone to the second vacuum parameter zone, altering the operating state of the robot system from the first state to a second state.

The vacuum parameter may be a vacuum level, the first vacuum parameter zone may be an item-not-held vacuum parameter zone, and the second vacuum parameter zone may be an item-held vacuum parameter zone. In such a case the second state may be translational movement of the item. The vacuum parameter may also be a rate of change of a vacuum level.

The operations performed by the robot system may include detecting the transition of the vacuum level from the item-held vacuum parameter zone to an item-secure vacuum parameter zone, and based on detecting the transition of the vacuum level from the item-held vacuum parameter zone to the item-secure vacuum parameter zone, altering the operating state of the robot system from the second state to a third state, wherein the third state is more rapid translational motion of the item.

The operations may further include monitoring the vacuum parameter during operation of the robot and detecting an unexpected change in the vacuum parameter based on the state in which the robot system is operating. In response to detecting the unexpected change, a remedial action may be taken.

If the vacuum parameter is a vacuum level, the first vacuum parameter zone may be an item secure vacuum parameter zone and the second vacuum parameter zone may be an item-held vacuum parameter zone. In such a case, the first state may be translational movement of the item and the second state may be slower translational movement of the item. The second vacuum parameter zone may also be an item breakage vacuum parameter zone, in which case the second state may be a remedial operating state.

Also provided is a non-transitory machine-readable medium including instructions which, when read by a machine, cause the machine to perform operations on or with a robot that includes a vacuum port for engaging an item. The operations may include any of the methods described above, including operating the robot in a first state, detecting, using a vacuum sensor, a transition of a vacuum parameter from a first vacuum parameter zone to a second vacuum parameter zone in a plurality of vacuum parameter zones including at least three vacuum parameter zones, and based on detecting the transition of the vacuum parameter from the first vacuum parameter zone to the second vacuum parameter zone, altering the operating state of the robot from the first state to a second state.

The vacuum parameter may be a vacuum level, the first vacuum parameter zone may be an item-not-held vacuum parameter zone, and the second vacuum parameter zone may be an item-held vacuum parameter zone. In such a case the second state may be translational movement of the item. The vacuum parameter may also be a rate of change of a vacuum level.

The operations defined by the machine readable instructions included with the machine-readable medium may include detecting the transition of the vacuum level from the item-held vacuum parameter zone to an item-secure vacuum parameter zone, and based on detecting the transition of the vacuum level from the item-held vacuum parameter zone to the item-secure vacuum parameter zone, altering the operating state of the robot system from the second state to a third state, wherein the third state is more rapid translational motion of the item.

The operations defined by the machine readable instructions may further include monitoring the vacuum parameter during operation of the robot and detecting an unexpected change in the vacuum parameter based on the state in which the robot system is operating. In response to detecting the unexpected change, a remedial action may be taken.

If the vacuum parameter is a vacuum level, the first vacuum parameter zone may be an item secure vacuum parameter zone and the second vacuum parameter zone may be an item-held vacuum parameter zone. In such a case, the first state may be translational movement of the item and the second state may be slower translational movement of the item. The second vacuum parameter zone may also be an item breakage vacuum parameter zone, in which case the second state may be a remedial operating state.

As mentioned above, an advantage of the data transmission protocol and the configuration of the wafer transfer system 200 discussed with reference to FIG. 2 and FIG. 3 is that hardware state data is transmitted rapidly between the nodes 300. Also, since hardware state data is transmitted in every alternate packet, and it is known how many transmission steps occur between non-adjacent nodes, the time delay between a hardware state update at one node and the receipt of that updated state at another node is known. This permits high resolution hardware state data to be monitored and captured for various purposes. An examples of hardware state data that can be monitored are the vacuum level as detected by the vacuum sensor 408 and an example of the hardware state data that can be captured along with the monitored hardware state(s), are the robot positional data.

For example, if there is an unexpected fluctuation that occurs in the vacuum level as detected by the vacuum sensor 408, a snapshot of the current hardware state data of the wafer transfer robot 100 can be captured at the time the fluctuation occurs, including for example the positions of the segment 106, segment 108 and support column 104. If it is determined that the fluctuation occurs at the same relative position between elements of the wafer transfer robot 100, it is likely that the movement of the robot is causing a pinch in the vacuum line 402. An appropriate message can be generated and other steps taken if the occurrence of such a problem is either severe or persistent. If the problem is persistent but not severe, appropriate maintenance or repair can be scheduled at a convenient time and before the problem becomes severe, and the hardware state data associated with the fluctuation (e.g. positional information) will permit easier diagnosis of the problem.

Similarly, if the vacuum level fails to reach an expected zone or level (e.g. above level 516 and into the wafer secure zone) a snapshot of the current hardware state of the wafer transfer robot 100 can be captured at each time this occurs, and if this occurs more than a certain number of times in a certain time interval, or if the average observed level in the wafer secure zone has drifted by more than a threshold amount, an appropriate message can then be generated and maintenance or repair can be scheduled before the problem intensifies.

This can also be applied to other aspects of the functioning of wafer transfer robot 100. For example, intermittent faults in data transmission, as determined by a calculated value for the CRC for a particular packet not matching the transmitted CRC value, may not affect the overall functioning of the robot but may be an early-warning indication of an upcoming problem that will affect the functioning of the wafer transfer robot 100, which error can be avoided with scheduled or preventative maintenance. For example, intermittent data transfer errors may be an indication of the beginning of the failure of a data transmission cable, which may result from intermittent breaks in its conductors as the cable flexes during movement of the robot. As with vacuum errors, the current hardware state of the wafer transfer robot 100 captured at the time the data transmission error occurs (e.g. positional information) can assist in identifying the cause of an intermittent fault and the implicated component, particularly if the intermittent fault occurs at or close to the same hardware state every time. As discussed herein, the determinations, adjustments and associated data capture are performed by the master node 208 but this could be performed by other data processors, either singly or in combination with the master node 208.

Figure 10:
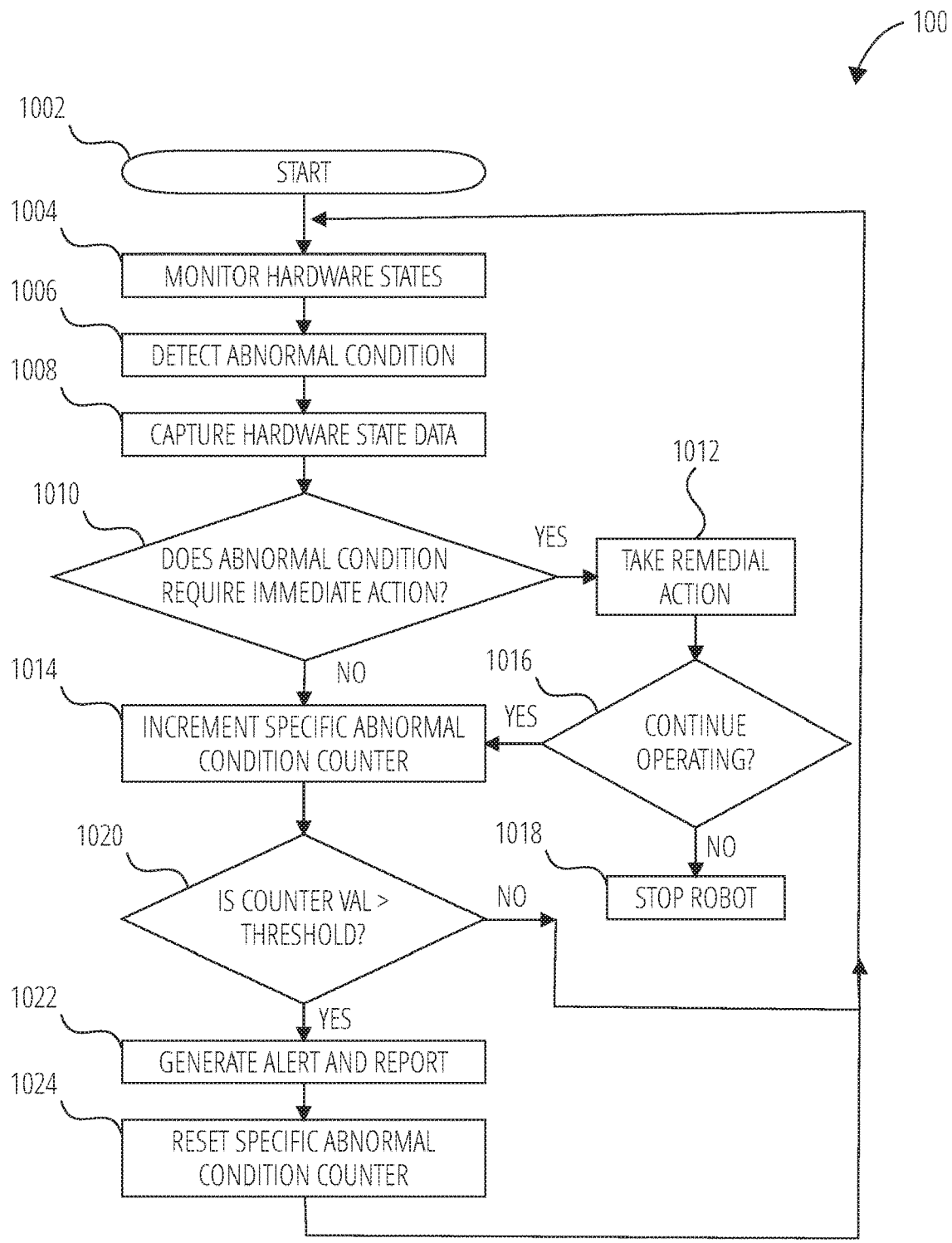
FIG. 10 is a flowchart that illustrates a diagnostic method, in accordance with an example embodiment, that may be used in the wafer transfer robot or wafer transfer system described herein.

FIG. 10 is a flowchart 1000 illustrating a diagnostic method according to one example. The method begins at operation 1002 with the robot in operation. At operation 1004 the master node 208 monitors the hardware states as received in its hardware information register 306.

When an abnormal condition is detected at operation 1006, the current hardware state data in the hardware information register 306 is captured and stored at operation 1008 in data storage associated with the master node 208, host computer 206 or a remote server. As used herein, current hardware state data is hardware state data at a time associated with one or more occurrences of the abnormal operating condition. Current hardware state data may thus include not only the just-captured hardware state data associated with the most recent occurrence of an operating condition, but this data will in many cases be grouped or associated, when stored, with hardware state data from earlier occurrences of the same condition. "Current" hardware state data may thus refer to both or either of data relating to the most recent occurrence of an abnormal event and historical data relating to that abnormal event.

Whether or not a variation in a condition rises to the level of an abnormal condition will depend on the system implementation. This could depend for example on the magnitude of the variation of the condition from an expected value or on the number of times an error condition is reported, for example a certain number of corrupt data packets within a certain time. The abnormal condition could for example be a vacuum parameter not reaching an expected level or zone or range of values as discussed above with reference to FIG. 9 or a data transmission error detected as above. Alternatively, the abnormal condition might be that a running average of the value of a parameter (e.g. the vacuum level) has drifted by more than a user-settable threshold amount or has crossed a particular level.

It is then determined at operation 1010 whether or not the abnormal condition requires remedial action, which is then taken at operation 1012. The remedial action in operation 1012 may for example be providing an error message or operating the wafer transfer robot 100 in a state other than expected or intended, as described above with reference to FIG. 6 to FIG. 8. It is then determined in operation 1016 whether or not the wafer transfer robot 100 can continue operating. If so, the method passes to operation 1014 where a counter for the specific abnormal condition is incremented, and the method continues from there. If it is determined in operation 1016 that the robot should not continue operating, for example in the case of complete loss of vacuum, it will be brought to a halt and shut down.

It will also be appreciated that certain errors or abnormal conditions may be handled without needing the determination in operation 1010 to be performed, due to the natural robust operation of the robot or to its error-handling capabilities. For example, corrupt data packets may just be ignored or retransmitted without an effect on the operation of the robot. In the case in which the robot continues operating normally despite the occurrence of the abnormal condition, the abnormal condition counter will nevertheless be incremented.

That is, abnormal conditions can be classified as critical or non-critical, depending on whether or not the wafer transfer robot 100 can continue operating. Non-critical errors in turn can be classified as either requiring some adjustment to the functioning of the wafer transfer robot 100 (e.g. a reduced vacuum level requiring slower robot movement or the drifting of a vacuum level) or not requiring any adjustment (e.g. data transmission errors below a threshold.) While as disclosed below, all abnormal conditions and associated current hardware state data are captured, in one example embodiment, the method described herein provides particular insight as to the ongoing operation of the robot by the fact that non-critical errors and associated states are tracked and captured.

Returning now to operation 1010, if the abnormal condition is not severe enough to require immediate remedial action, the method proceeds to operation 1014 where a counter for the specific abnormal condition is incremented. This allows tracking of different abnormal conditions.

It is then checked at operation 1020 if the counter for the specific abnormal condition exceeds a predetermined threshold value. If the counter does not exceed the threshold value, the method returns to operation 1004 and the monitoring of the hardware states continue. If the counter value exceeds the predetermined threshold in operation 1020, an alert and an associated report, containing the hardware state information gathered in operation 1022, is generated. The specific abnormal condition counter is then reset at operation 1024 and the method returns to operation 1004 for continued hardware monitoring.

It should also be noted that if the counter for a particular abnormal condition does not pass the threshold in a certain time, it could also be reset. That is, the number of abnormal conditions occurring per unit time may be used to either ignore the occurrence of abnormal events or to generate an alert and report in operation 1022. For example, it may be expected that a certain number of data transmission errors will occur in a certain time interval without indicating a nascent problem, or that unexpected fluctuations in vacuum level may similarly occur during normal operation of the wafer transfer robot 100.

By resetting an abnormal condition counter periodically if it has not exceeded its threshold, the alert and reporting of operation 722 will not be triggered merely by expected operation of the wafer transfer robot 100 over an extended period of time. Similarly, if a number of abnormal conditions are detected in a short time, the alert and reporting of operation 1022 may be triggered even if the normal threshold has not yet been breached. Accordingly, in an alternative or concurrent example of the flowchart 1000, the test in operation 720 is "Is the counter value greater than the threshold value over a certain time."

Accordingly, provided is a method of operating a robot performed by one or more processors, comprising receiving hardware state data relating to operation of the robot, detecting an occurrence of an abnormal operating condition of the robot during operation from the hardware state data, and capturing current hardware state data of the robot at a time associated with the occurrence of the abnormal operating condition, including robot positional information.

A counter corresponding to the abnormal operating condition may be incremented and if it is determined that the value of the counter is greater than a threshold value then a report including captured current hardware state data may be generated. Similarly, if it is determined that the counter is greater than a threshold value over a predetermined time, a report including captured current hardware state data may then be generated.

The abnormal operating condition may be a data transmission error, a fluctuation in pressure in a vacuum line or a drift in an operational parameter beyond a threshold. If it is determined that the abnormal operating condition is severe enough to require remedial action then the robot may be operated in a remedial state.

Also provided is a robot system comprising a robot arm, an effector coupled to the robot arm, the effector to engage an item, one or more data processors in communication with the robot arm to control operation of the robot system, and one or more machine-readable mediums storing instructions that, when executed by the one or more data processors, cause the robot system to perform certain operations. The operations may include receiving hardware state data relating to operation of the robot system, detecting an occurrence of an abnormal operating condition of the robot system during operation from the hardware state data, and capturing current hardware state data of the robot system at a time associated with the occurrence of the abnormal operating condition, including robot positional information.

The operations may further comprise incrementing a counter corresponding to the abnormal operating condition and if it is determined that the counter is greater than a threshold value, a report may be generated including captured current hardware state data. Similarly, if it is determined that the counter is greater than a threshold value over a predetermined time, a report including captured current hardware state data may be generated.

The abnormal operating condition may be selected from the group consisting of a data transmission error and a pressure fluctuation in a vacuum line or a drift in an operational parameter beyond a threshold. If it is determined that the abnormal operating condition is severe enough to require remedial action, the robot system may then be operated in a remedial state Further, provided is a non-transitory machine-readable medium including instructions which, when read by a machine, cause the machine to perform operations on or with a robot, comprising receiving hardware state data relating to operation of the robot, detecting an occurrence of an abnormal operating condition of the robot during operation, from the hardware state data, and capturing current hardware state data of the robot at a time associated with the occurrence of the abnormal operating condition, including robot positional information.

The operations may further comprise incrementing a counter corresponding to the abnormal operating condition and if it is determined that the counter is greater than a threshold value, a report may be generated including captured current hardware state data. Similarly, if it is determined that the counter is greater than a threshold value over a predetermined time, a report including captured current hardware state data may be generated.

Figure 11:
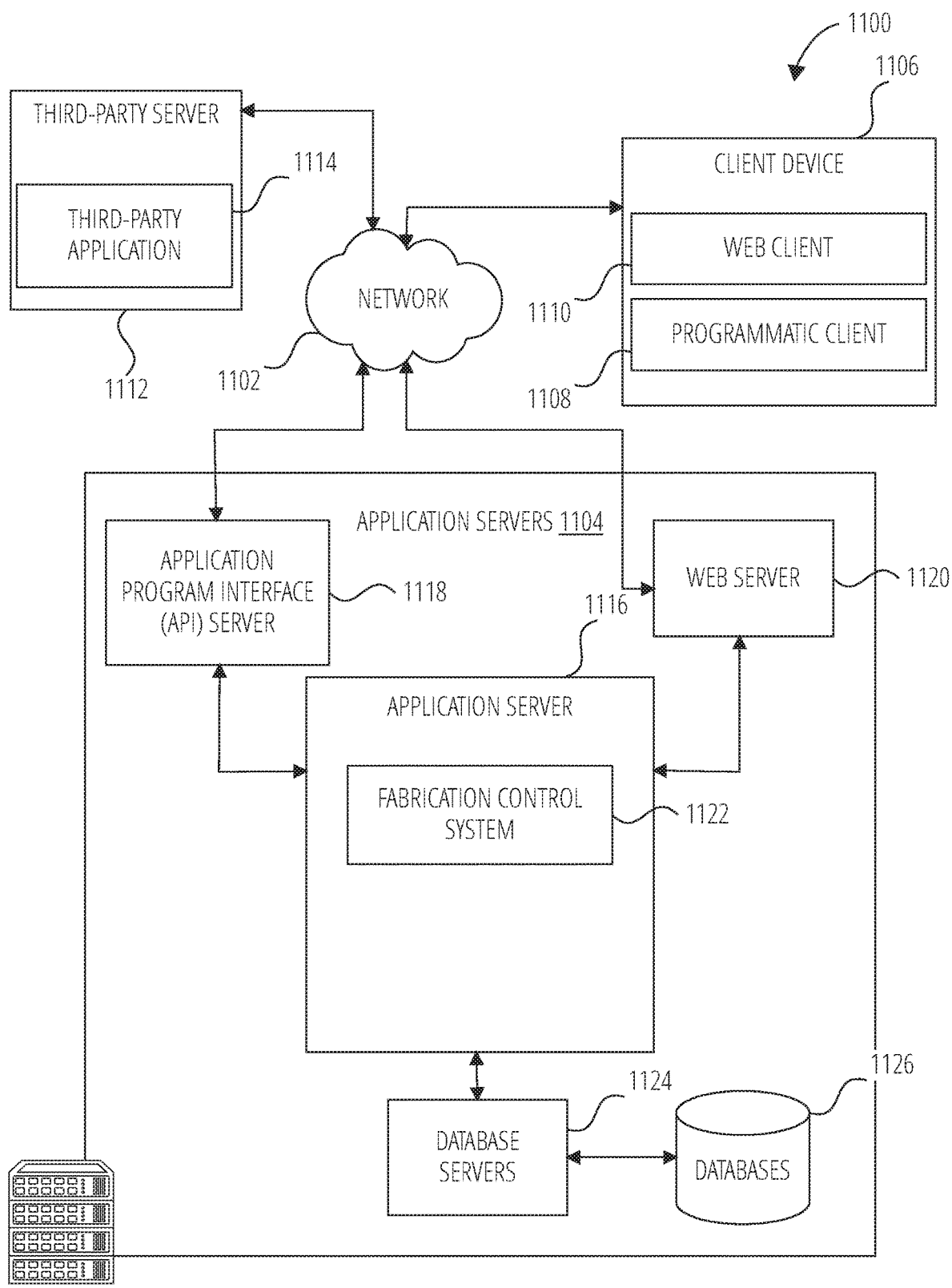
FIG. 11 is a diagrammatic representation of a networked environment in which the present disclosure may be deployed, in accordance with some example embodiments.

The abnormal operating condition may be selected from the group consisting of a data transmission error and a pressure fluctuation in a vacuum line or a drift in an operational parameter beyond a threshold. If it is determined that the abnormal operating condition is severe enough to require remedial action, the robot system may then be operated in a remedial state FIG. 11 is a diagrammatic representation of a networked computing environment 1100 in which some example embodiments of the present disclosure may be implemented or deployed.

One or more application servers 1104 provide server-side functionality via a network 1102 to a networked user device, in the form of a client device 1106. An example of a client device is the wafer transfer robot 100 or one of the nodes 300 therein. A web client 1110 (e.g., a browser) and a programmatic client 1108 (e.g., an "app") may be hosted and execute on the web client 1110.

An Application Program Interface (API) server 1118 and a web server 1120 provide respective programmatic and web interfaces to application servers 1104. A specific application server 1116 hosts a fabrication control system 822, which includes relevant components, modules and/or applications.

The web client 1110 communicates with the fabrication control system 1122 via the web interface supported by the web server 1120. Similarly, the programmatic client 1108 communicates with the fabrication control system 1122 via the programmatic interface provided by the Application Program Interface (API) server 1118.

The application server 1116 is shown to be communicatively coupled to database servers 1124 that facilitates access to an information storage repository or databases 1126. In an example embodiment, the databases 1126 includes storage devices that store information to be published and/or processed and/or received from the fabrication control system 1122.

Additionally, a third-party application 1114 executing on a third-party server 1112, is shown as having programmatic access to the application server 1116 via the programmatic interface provided by the Application Program Interface (API) server 1118. For example, the third-party application 1114, using information retrieved from the application server 1116, may support one or more features or functions on a website hosted by the third party.

Figure 12:
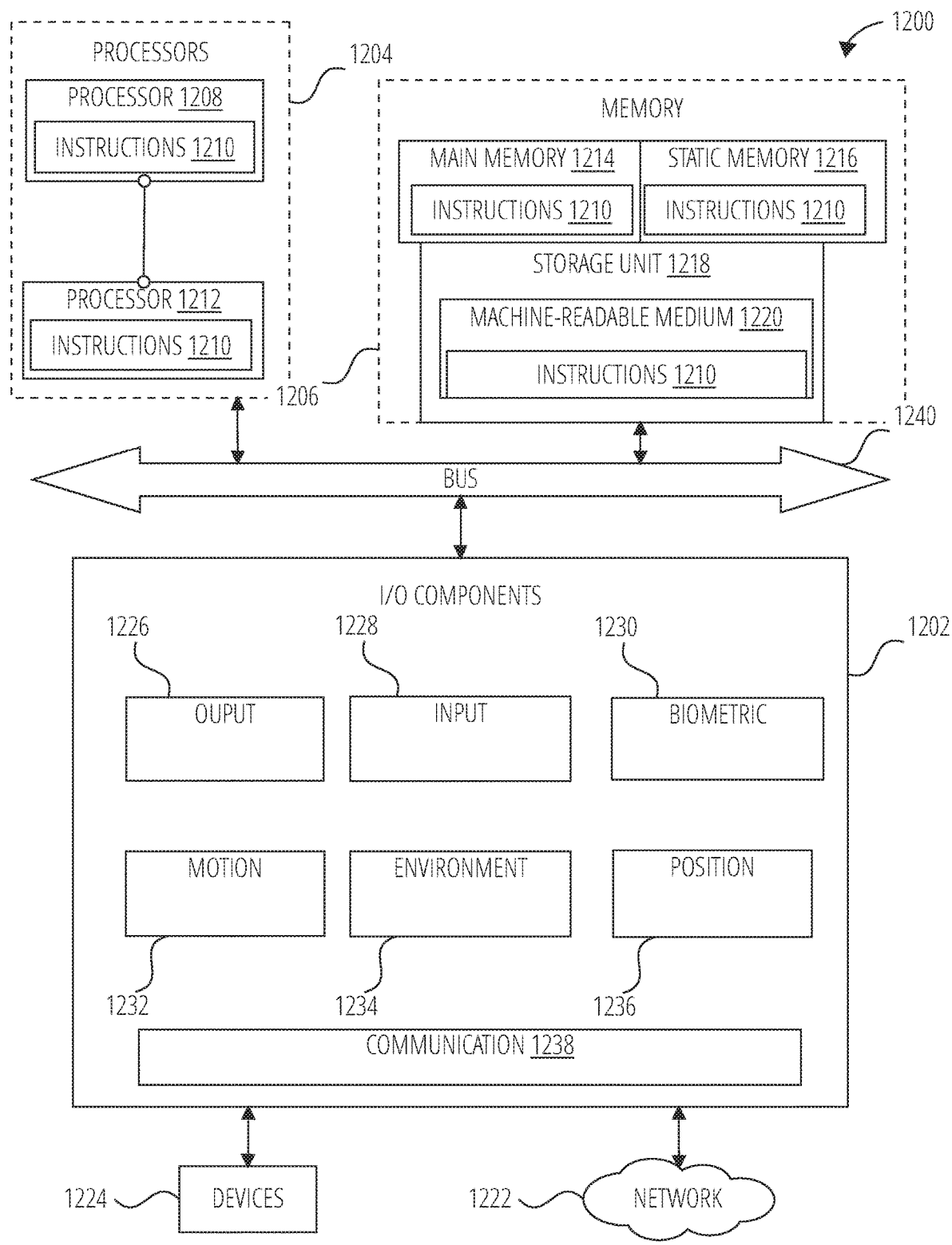
FIG. 12 is a diagrammatic representation of a machine in the form of a computer system within which a set of instructions may be executed for causing the machine to perform any one or more of the methodologies discussed herein, in accordance with some example embodiments.

FIG. 12 is a diagrammatic representation of the machine 1200 within which instructions 1210 (e.g., software, a program, an application, an applet, an app, or other executable code) for causing the machine 1200 to perform any one or more of the methodologies discussed herein may be executed. For example, the instructions 1210 may cause the machine 1200 to execute any one or more of the methods described herein. The instructions 1210 transform the general, non-programmed machine 1200 into a particular machine 1200 programmed to carry out the described and illustrated functions in the manner described. The machine 1200 may operate as a standalone device or may be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1210, sequentially or otherwise, that specify actions to be taken by the machine 1200. Further, while only a single machine 1200 is illustrated, the term "machine" shall also be taken to include a collection of machines that individually or jointly execute the instructions 1210 to perform any one or more of the methodologies discussed herein.

The machine 1200 may include processors 1204, memory 1206, and I/O components 1202, which may be configured to communicate with each other via a bus 1240. In an example embodiment, the processors 1204 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another Processor, or any suitable combination thereof) may include, for example, a Processor 1208 and a Processor 1212 that execute the instructions 1210. The term "Processor" is intended to include multi-core processors that may comprise two or more independent processors (sometimes referred to as "cores") that may execute instructions contemporaneously. Although FIG. 12 shows multiple processors 1204, the machine 1200 may include a single Processor with a single core, a single Processor with multiple cores (e.g., a multi-core Processor), multiple processors with a single core, multiple processors with multiples cores, or any combination thereof.

The memory 1206 includes a main memory 1214, a static memory 1216, and a storage unit 1218, both accessible to the processors 1204 via the bus 1240. The main memory 1206, the static memory 1216, and storage unit 1218 store the instructions 1210 embodying any one or more of the methodologies or functions described herein. The instructions 1210 may also reside, completely or partially, within the main memory 1214, within the static memory 1216, within machine-readable medium 1220 within the storage unit 1218, within at least one of the processors 1204 (e.g., within the Processor's cache memory), or any suitable combination thereof, during execution thereof by the machine 1200.

The I/O components 1202 may include a wide variety of components to receive input, provide output, produce output, transmit information, exchange information, capture measurements, and so on. The specific I/O components 1202 that are included in a particular machine will depend on the type of machine. For example, portable machines such as mobile phones may include a touch input device or other such input mechanisms, while a headless server machine will likely not include such a touch input device. It will be appreciated that the I/O components 1202 may include many other components that are not shown in FIG. 12. In various example embodiments, the I/O components 1202 may include output components 1226 and input components 1228. The output components 1226 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, valves and switches and so forth. The input components 1228 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1202 may include biometric components 1230, motion components 1232, environmental components 1234, or position components 1236, among a wide array of other components. For example, the biometric components 1230 include components to detect expressions (e.g., hand expressions, facial expressions, vocal expressions, body gestures, or eye-tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1232 include acceleration sensor components (e.g., accelerometer), gravitation sensor components, rotation sensor components (e.g., gyroscope). The environmental components 1234 include, for example, one or cameras, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), vacuum sensors or other components that may provide indications, measurements, or signals corresponding to a surrounding physical environment. The position components 1236 include location sensor components (e.g., a GPS receiver Component), altitude sensor components (e.g., altimeters or barometers that detect air pressure from which altitude may be derived), orientation sensor components (e.g., magnetometers), and the like.

Communication may be implemented using a wide variety of technologies. The I/O components 1202 further include communication components 1238 operable to couple the machine 1200 to a network 1222 or devices 1224 via respective coupling or connections. For example, the communication components 1238 may include a network interface Component or another suitable device to interface with the network 1222. In further examples, the communication components 1238 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1224 may be another machine or any of a wide variety of peripheral devices (e.g., a peripheral device coupled via a USB).

Moreover, the communication components 1238 may detect identifiers or include components operable to detect identifiers. For example, the communication components 1238 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1238, such as location via Internet Protocol (IP) geolocation, location via Wi-Fi® signal triangulation, location via detecting an NFC beacon signal that may indicate a particular location, and so forth.

The various memories (e.g., main memory 1214, static memory 1216, and/or memory of the processors 1204) and/or storage unit 1218 may store one or more sets of instructions and data structures (e.g., software) embodying or used by any one or more of the methodologies or functions described herein. These instructions (e.g., the instructions 1210), when executed by processors 1204, cause various operations to implement the disclosed embodiments.

The instructions 1210 may be transmitted or received over the network 1222, using a transmission medium, via a network interface device (e.g., a network interface Component included in the communication components 1238) and using any one of several well-known transfer protocols (e.g., hypertext transfer protocol (HTTP)). Similarly, the instructions 1210 may be transmitted or received using a transmission medium via a coupling (e.g., a peer-to-peer coupling) to the devices 1224.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method of operating a robot including a robot arm comprising multiple elements, the method being performed by one or more processors, the method comprising:
   receiving hardware state data relating to operation of the robot;
   detecting an occurrence of an intermittent abnormal operating condition of the robot from the hardware state data, while the robot arm is moving from a first location to a second location; and
   capturing current hardware state data of the robot at a time associated with the occurrence of the intermittent abnormal operating condition, including robot positional information,
   wherein the robot positional information comprises relative positions between the elements of the robot arm when the intermittent abnormal operating condition occurred during movement of the robot arm from the first location to the second location.

2. The method of claim 1 further comprising:
   incrementing a counter corresponding to the intermittent abnormal operating condition.

3. The method of claim 2 further comprising:
   determining that the counter is greater than a threshold value; and
   in response, generating a report including the captured current hardware state data.

4. The method of claim 1 wherein the intermittent abnormal operating condition is an intermittent data transmission error.

5. The method of claim 1 wherein the intermittent abnormal operating condition is an intermittent fluctuation in pressure in a vacuum line.

6. The method of claim 1, further comprising:
   determining that the intermittent abnormal operating condition is severe enough to require remedial action; and
   in response, operating the robot in a remedial state.

7. The method of claim 6, further comprising:
   incrementing a counter corresponding to the intermittent abnormal operating condition.

8. The method of claim 7, further comprising:
   determining that the counter is greater than a threshold value over a predetermined time; and
   in response, generating a report including the captured current hardware state data.

9. A robot system, comprising:
   a robot arm comprising multiple elements;
   an effector coupled to the robot arm, the effector to engage an item;
   one or more data processors in communication with the robot arm to control operation of the robot system; and
   one or more machine-readable mediums storing instructions that, when executed by the one or more data processors, cause the robot system to perform operations comprising:
   receiving hardware state data relating to operation of the robot system;
   detecting an occurrence of an intermittent abnormal operating condition of the robot system from the hardware state data, while the robot arm is moving from a first location to a second location; and
   capturing current hardware state data of the robot system at a time associated with the occurrence of the intermittent abnormal operating condition, including robot positional information, wherein the robot positional information comprises relative positions between the elements of the robot arm when the intermittent abnormal operating condition occurred during movement of the robot arm from the first location to the second location.

10. The robot system of claim 9 wherein the operations further comprise:
    incrementing a counter corresponding to the intermittent abnormal operating condition.

11. The robot system of claim 9 wherein the operations further comprise:
    determining that the intermittent abnormal operating condition is severe enough to require remedial action; and
    in response, operating the robot system in a remedial state.

12. The robot system of claim 9 wherein the intermittent abnormal operating condition is selected from the group consisting of an intermittent data transmission error and an intermittent pressure fluctuation in a vacuum line.

13. The robot system of claim 10 wherein the operations further comprise:
    determining that the counter is greater than a threshold value; and
    in response, generating a report including the captured current hardware state data.

14. A non-transitory machine-readable medium including instructions which, when read by a machine, cause the machine to perform operations on or with a robot including a robot arm comprising multiple elements, the operations comprising:
    receiving hardware state data relating to operation of the robot;
    detecting an occurrence of an intermittent abnormal operating condition of the robot from the hardware state data, while the robot arm is moving from a first location to a second location; and
    capturing current hardware state data of the robot at a time associated with the occurrence of the intermittent abnormal operating condition, including robot positional information,
    wherein the robot positional information comprises relative positions between the elements of the robot arm when the intermittent abnormal operating condition occurred during movement of the robot arm from the first location to the second location.

15. The non-transitory machine-readable medium of claim 14 wherein the operations further comprise:
   incrementing a counter corresponding to the intermittent abnormal operating condition.

16. The non-transitory machine-readable medium of claim 14 wherein the operations further comprise:
   determining that the intermittent abnormal operating condition is severe enough to require remedial action; and
   in response, operating the robot in a remedial state.

17. The non-transitory machine-readable medium of claim 14 wherein the intermittent abnormal operating condition is selected from the group consisting of an intermittent data transmission error and an intermittent pressure fluctuation in a vacuum line.

18. The non-transitory machine-readable medium of claim 15 wherein the operations further comprise:
   determining that the counter is greater than a threshold value; and
   in response, generating a report including the captured current hardware state data.

\* \* \* \* \*